United States Patent [19]

MacFall et al.

[11] Patent Number: 4,709,212
[45] Date of Patent: Nov. 24, 1987

[54] METHOD OF ENHANCING IMAGE SIGNAL-TO-NOISE RATIO BY COMBINING NMR IMAGES OF DIFFERING PULSE SEQUENCE TIMING

[75] Inventors: James R. MacFall, Hartland; Gary H. Glover, Delafield, both of Wis.

[73] Assignee: General Electric Company, Milwaukee, Wis.

[21] Appl. No.: 816,014

[22] Filed: Jan. 3, 1986

[51] Int. Cl.$^4$ ............................................ G01R 33/20
[52] U.S. Cl. ..................................... 324/309; 324/300
[58] Field of Search ............... 324/300, 307, 309, 311, 324/313, 314; 128/653

[56] References Cited

U.S. PATENT DOCUMENTS

| | | | |
|---|---|---|---|
| 4,442,404 | 4/1984 | Bergmann | 324/309 |
| 4,471,305 | 9/1984 | Crooks et al. | 324/309 |
| 4,475,084 | 10/1984 | Moore et al. | 324/309 |

FOREIGN PATENT DOCUMENTS

WO85/02264  5/1985  PCT Int'l Appl. .

Primary Examiner—Michael J. Tokar
Attorney, Agent, or Firm—Mark L. Mollon; Douglas E. Stoner

[57] ABSTRACT

A method is provided for enhancing image signal-to-noise ratio (SNR) by combining NMR acquired images of differing pulse sequence timing. In one embodiment, a plurality of multi-echo images acquired at different spin-echo times are used to compute values of spin-spin relaxation ($T_2$) and pseudospin density (PD) for each pixel in the multi-echo images. These values are used to generate new images at a spin-echo time $TE_c$ for which actual measurements may not have been taken. In another embodiment, the calculated $T_2$ images are used to extrapolate (by multiplying each pixel by an appropriate factor) each of the acquired images to some spin-echo time $TE_c$. The extrapolated image can now be averaged to produce an image with improved SNR. In yet another embodiment, similar techniques are used to improve the SNR of images acquired by varying parameters, such as pulse sequence repetition time TR, which effect the spin-lattice ($T_1$) dependence of the image.

13 Claims, 7 Drawing Figures

METHOD OF ENHANCING IMAGE SIGNAL-TO-NOISE RATIO BY COMBINING NMR IMAGES OF DIFFERING PULSE SEQUENCE TIMING

BACKGROUND OF THE INVENTION

This invention relates to methods for performing nuclear magnetic resonance (NMR) studies. More specifically, this invention relates to improved methods for advantageously combining several acquired NMR images of the same region of a sample object to improve the signal-to-noise ratio of the resulting image.

Various techniques are known for producing NMR images which may be of medical diagnostic value. In general, imaging techniques require that the object or person studied be placed in a homogeneous magnetic field and subjected to radio frequency (RF) excitation and magnetic field gradient pulses. The RF pulses excite nuclear spins in the object region of interest to produce NMR signals. Magnetic field gradient pulses function to localize the NMR signal to a specific region within the object and to encode spatial information. Imaging techniques differ in the sequence and types of RF and gradient pulses employed. A particular combination of pulses is generally referred to as a "pulse sequence." For a given pulse sequence, the time intervals between pulses are called the pulse sequence timing parameters.

The observed NMR signals depend in known ways on the distribution of nuclear spin parameters, such as nuclear spin density ($M_o$), spin lattice relaxation time ($T_1$), and spin-spin relaxation time ($T_2$). The contribution of each such nuclear spin parameter to the observed signal varies with the particular imaging technique (pulse sequence) and choice of timing parameters.

For example, in the spin-echo imaging technique one or more 180° time reversal RF pulses are used to generate multiple spin-echo signals for each RF excitation pulse. In the case of multiple spin-echo signals, the signals originate from the same nuclear spins in the excited region, but occur at different echo times $TE_i$, i=1, ... 4, etc., where i denotes the first, second, etc., spin-echo signal. In the course of a complete scan, sufficient data is collected to reconstruct an image corresponding to a spin-echo signal at each time $TE_i$. Such images are known as acquired multiple spin-echo NMR images. The images are not identical since the contrast between various tissues changes at different $TE_i$ due to differential spin-spin ($T_2$) decay. In addition, the overall signal level decreases causing the images to become darker as $TE_i$ increases. Hence, TE is the timing parameter for the spin-echo pulse sequence that affects the contribution of $T_2$ to the NMR signal and ultimately image contrast.

In medical NMR imaging one reason to acquire multiple spin-echo images is that various pathology, such as, for example, edema, is better visualized in images sensitive to longer TE times, whereas an associated tumor may be better imaged at shorter echo times. Also, since it is known that at certain combinations of $T_1$ and $T_2$, some tissues or pathology can have zero contrast, the multiple echo scan reduces risk of not visualizing a structure or pathology. A further reason that such multiple spin-echo images are routinely acquired is that the scan time is not substantially increased by the acquisition of more than one spin-echo signal. This is due to the fact that the time used to acquire the additional spin-echo signals is normally spent waiting for the nuclear spins to return to equilibrium prior to the next excitation step.

One way in which it would be desirable to utilize such multiple spin-echo images is to attempt to, for example, average the images in some way to improve the signal-to-noise ratio (SNR) in the averaged image. It is known, for example, that if images are acquired with the same pulse sequence and timing, then a new image which is the average of the other images will exhibit an improved signal-to-noise ratio. However, although multiple spin-echo signals are acquired of the same region with the same pulse sequence, they do not have the same timing, since each image corresponds to a different spin-echo time. The result in that the differing timing produces images in which the same structures have different contrasts so that simple addition of the images can result in an image which will not be simply interpretable and, hence, not very useful.

A similar difficulty exists interpreting images acquired from single spin-echo sequences wherein the images of the same object region are each acquired for the same value of TE, but for different values of pulse sequence repetition time TR. Each image would have different contrasts due to differential spin-lattice ($T_1$) recovery. Hence, TR is the timing parameter for the multiple TR pulse sequence that affects the contribution of $T_1$ to the signal and image contrast. Such images may be acquired for reasons similar to those discussed above for multi-echo images. Different pathology in this case may have best contrast at different values of TR. However, obtaining (e.g., four) images with different values of TR will require significantly more time than acquiring one image, unlike the multi-echo case mentioned above. Again, it is desirable to combine the images acquired at different values of TR so that the resulting image has clearly interpretable features and also exhibits an improvement.

It is therefore an object of the invention to provide a method for meaningfully combining multiple spin-echo images to produce an image having an improved signal-to-noise ratio.

It is another object of the invention to provide a method for meaningfully combining spin-echo images of different pulse sequence repetition times TR to improve the SNR of the resulting image.

It is a further object of the invention to provide a method for meaningfully combining images resulting from pulse sequences which have different $T_1$ and/or $T_2$ weighting.

SUMMARY OF THE INVENTION

An inventive method is provided for generating NMR images which have improved signal-to-noise ratios relative to an acquired NMR image which has substantially similar contrast, where the image contrast is determined by at least one contrast determining parameter. The method includes the steps of acquiring sufficient NMR data from a sample object to spatially characterize a plurality of NMR parameters of the object, and generating a plurality of values related to at least one of the NMR parameters. A value is then selected for each of the contrast determining parameters, followed by generation of an NMR image using the generated values and the selected values of the contrast determining parameters. The values of the contrast determining parameters are selected such that the computed image has an improved signal-to-noise ratio relative to an acquired image having substantially similar contrast.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
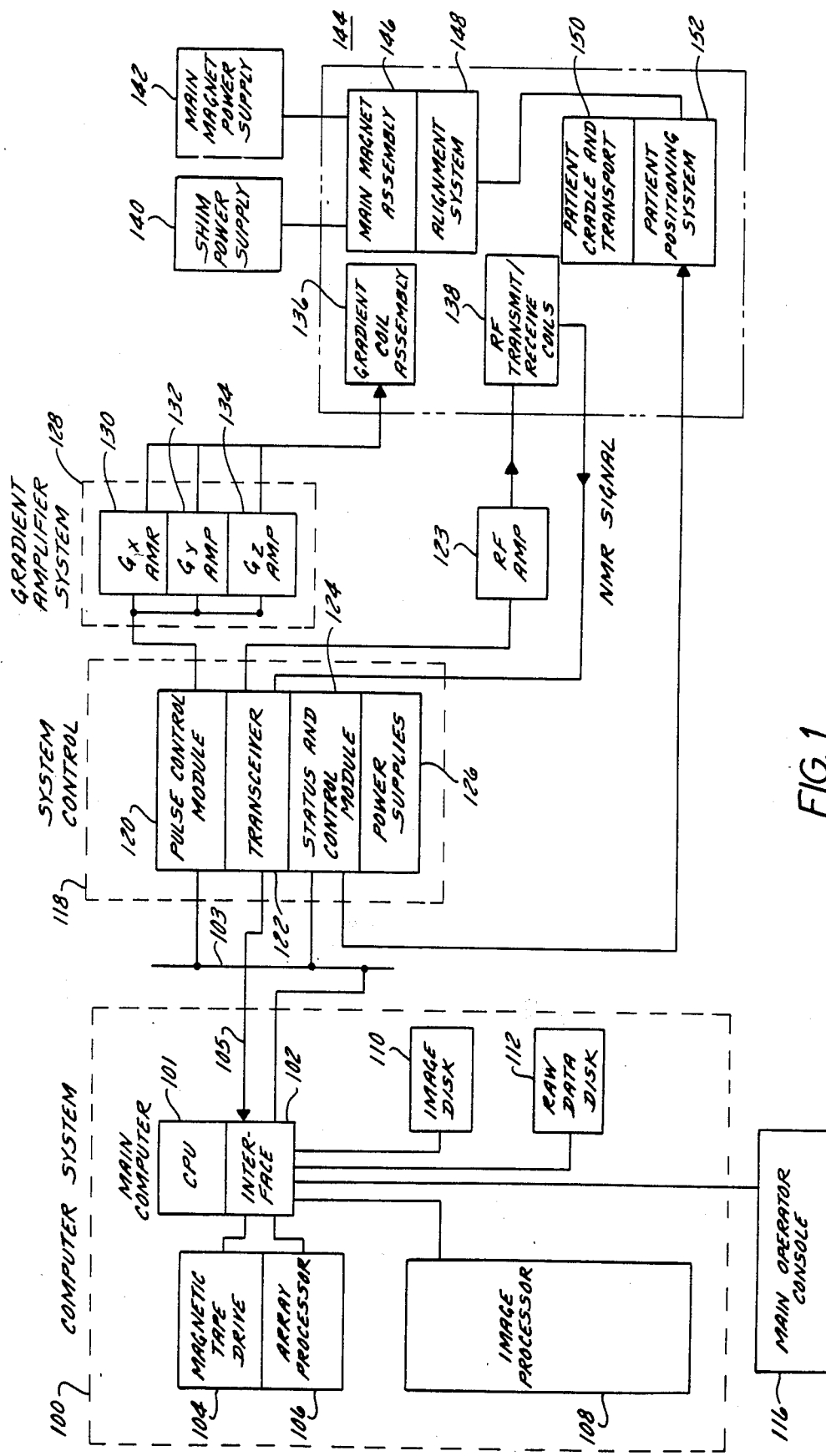
FIG. 1 is a block diagram schematic of an NMR system.

Referring first to FIG. 1, there is shown in block diagram form the major components of an exemplary NMR system. It should be understood, however, that this is an exemplary embodiment of the apparatus and that in fact the invention is not apparatus dependent. Overall system operation is under the control of a computer system generally designated 100 which includes a main computer 101 (such as a Data General MV4000). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. An array processor 106 is utilized for pre-processing data and data reconstruction. The function of image processor 108 is to provide interactive image display manipulation such as magnification, image comparison, and gray scale adjustment. The computer system is provided with a means to store raw (unreconstructed) image data utilizing a disc data storage system designated 11. An operator console 116 is also coupled to the computer by means of interface 102 and provides the operator with the means to input data pertinent to a patient study as well as additional data necessary for proper NMR system operation, such as initiating and terminating scans. The operator console may also be used to display images stored on discs or magnetic tape.

The computer system exercises control over the NMR system by means of control and gradient amplifier systems generally designated 118 and 128, respectively. The computer communicates with system control 118 by means of a digital communication network 103 (such as the Ethernet network) in a manner well known to those skilled in the art. The system control includes several subsystems such as the pulse control module (PCM) 120, a radio frequency transceiver 122, a status and control module (SCM) 124, and the power supplies generally designated 126 necessary to energize the components. The PCM utilizes control signals provided by computer 101 to generate digital timing and control signals such as the current waveforms used for gradient coil excitation, as well as RF envelope waveforms utilized in the transceiver for modulating RF pulses. The gradient waveforms are applied to the gradient amplifier system 128 generally comprised of $G_x$, $G_y$, and $G_z$ amplifiers 130, 132, and 134, respectively, each utilized to excite a corresponding gradient coil in an assembly generally designated 136 and which is part of a magnet assembly 146. When energized, the gradient coils generate substantially linear, mutually orthogonal magnetic field gradients $G_x$, $G_y$, $G_z$ directed in the X-, Y-, and Z-axis directions or a Cartesian coordinate system. The point of intersection defined by the planes containing each of the gradients is termed an "isocenter" and normally is situated substantially at the center of the static magnetic field volume. The reconstructed images are typically centered at the isocenter.

The gradient magnetic fields are utilized in combination with radio frequency pulses generated by transceiver 122 to encode spatial information into the NMR signals emanating from the region of the patient being studied. Waveforms and control signals provided by the pulse control module are utilized by transceiver subsystem 122 for RF carrier modulation and control of the operating mode; that is, the transmit or receive mode. In the transmit mode, the transmitter provides a radio frequency carrier waveform modulated in accordance with the control signals to an RF power amplifier 123 which then energizes RF coils 138 which are situated within main magnet assembly 146. The NMR signals radiated by the excited nuclei are sensed by the same of a different RF coil than is used for transmitting. The signals are detected, filtered, and digitized in the receiver section of the transceiver. The digitized signals are transmitted to the main computer for processing by means of a dedicated, unidirectional, high-speed digital link 105 which links interface 102 and transceiver 122.

The PCM and SCM are independent subsystems both of which communicate with main computer 101, peripheral systems, such as patient positioning system 152, as well as to one another by means of link 103. The PCM and SCM are each comprised of a 16-bit microprocessor (such as an Intel 8086) for processing commands from the main computer. The SCM includes means for acquiring information regarding patient cradle (not shown) position and position of the moveable patient alignment light fan beam (not shown). This information is used by the main computer to modify image display and reconstruction parameters. The SCM also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply is utilized to energize shim coils associated with the main magnet and which are used to correct inhomogeneities in the polarizing magnetic field. In the case of a resistive magnet, main magnet power supply 142 is utilized to continuously energize the magnet. In the case of a superconductive magnet, the power supply is utilized to bring the magnet to the proper operating field and then is disconnected. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the associated power supplies and patient-handling devices, are enclosed in an RF-shielded room generally designated 144. The shielding is generally provided by a copper or aluminum screen network which encloses the entire room. The screen network serves to contain the RF signals generated by the system, while shielding the system from RF signals generated outside the room. A bidirectional attenuation of approximately 100 db. is typical in the frequency range of operation.

Figure 2:
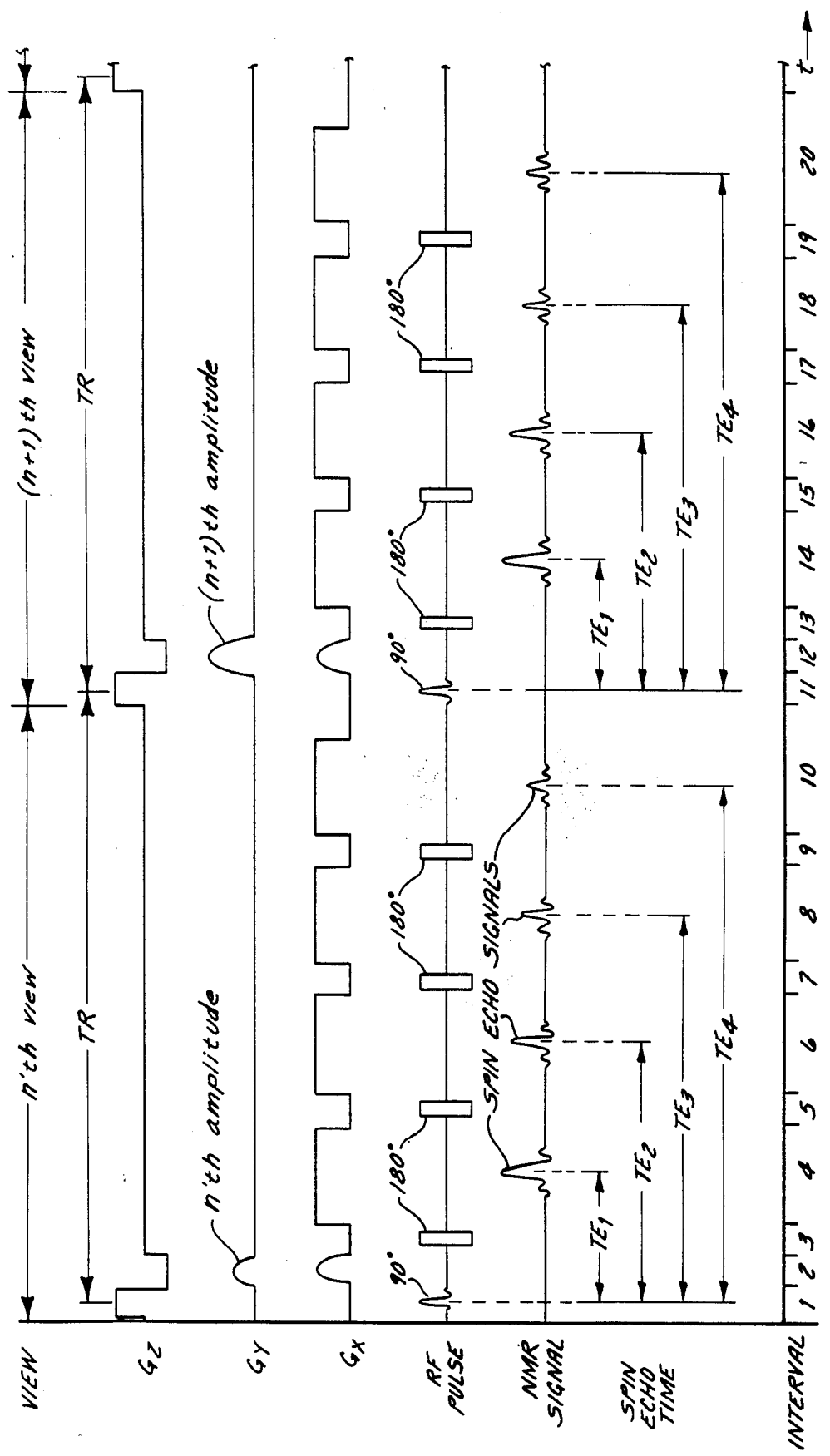
FIG. 2 depicts two views of an exemplary embodiment of a spin-echo, Fourier transform NMR pulse sequence of the type known as spin warp which is useful in practicing the method of the invention.

A pulse sequence useful in acquiring multiple spin-echo image data is shown in FIG. 2 which depicts two views of a two-dimensional Fourier transform (2DFT) NMR imaging technique commonly referred to as spin warp. The views comprise intervals 1-10 and 11-20 as indicated along the horizontal axis. A complete pulse sequence (scan) would typically consist of 128, 256, or 512 views which are substantially identical to one another with the exception that a different amplitude of the phase encoding magnetic field gradient pulse $G_y$, as indicated along the vertical axis, is employed in each view (assume no averaging).

One exemplary view comprising intervals 1-10 will now be described in detail. In interval 1, a selective, 90° RF excitation pulse is applied in the presence of a positive $G_z$ gradient pulse so as to preferentially excite nuclear spins in a predetermined region of a sample object (not shown) having precession frequencies as predicted by the Larmor equation. A negative $G_z$ pulse is applied in interval 2 to rephase nuclear spins excited in interval 1. Typically, the $G_z$ gradient pulses are selected such that the time integral of the gradient pulse waveform over interval 2 is equal to a negative one half of the time integral of the gradient pulse waveform over interval 1. $G_x$ and $G_y$ magnetic field gradient pulses are applied simultaneously with the $G_z$ gradient pulse in interval 2. The function of the $G_y$ gradient is as alluded to hereinabove, to encode phase information into the excited nuclear spins. The purpose of the $G_x$ gradient pulse is to dephase the excited nuclear spins by a predetermined amount to delay the occurrence of the NMR spin-echo signal in interval 4 to a time $TE_1$ after the mean application of the excitation pulse in interval 1. The spin-echo signal is produced by the application of a 180° inverting pulse in interval 3. The spin-echo signal is sampled in interval 4 in the presence of a linear $G_x$ readout gradient. In accordance with the technique of multiple spin-echo imaging, additional inverting 180° RF pulses are applied in intervals 5, 7, and 9 so as to produce spin-echo signals in intervals 6, 8, and 10, respectively, occuring at echo delay times $TE_2$, $TE_3$, and $TE_4$, respectively. The spin-echo signals occurring in intervals 6, 8, and 10 are also observed in the presence of linear $G_x$ readout gradients. The NMR information encoded in the NMR signal by the phase encoding and the readout gradients is recovered in a well-known manner using two-dimensional Fourier transform techniques. It should be noted that the number of spin-echo signals that can be acquired in a single view is ultimately limited by the $T_2$ relaxation constant of the nuclei in the region of interest.

The excitation/sampling process, as described hereinabove, is repeated in each view of the pulse sequence until the $G_y$ gradient is sequenced through its range of amplitudes (128, 256, etc.). In this manner, in the course of a complete scan four spin-echo signals in the pulse sequence detected in FIG. 2 are observed in each view thereby providing sufficient data to reconstruct four images, each corresponding to the spin-echo signals occuring at echo times $TE_1-TE_4$. The repetition time TR, indicated in FIG. 2, is the period of time between the beginning of a pulse sequence of one view and the beginning of a succeeding (essentially identical, except for the amplitude of the $G_y$ phase encoding gradient) pulse sequence of the next view. As depicted in FIG. 2, TR is measured between the mean application of 90° RF pulses and succeeding views. Typically, TR is not varied in the course of a single scan. However, TR can be varied from one scan to the next.

The signal produced in an NMR apparatus due to spins excited by typical pulse sequences can be analyzed using the Bloch equations, which are well known in the field of NMR (P. Mansfield, P. G. Morris, "NMR Imaging in Biomedicine," Academic Press, New York (1982) p. 42, and R. Freeman and H. D. W. Hill, J. Magn. Reson., Vol. 4, p. 366 (1971)). The result of applying the Bloch Equations to the single echo spin-echo sequence (e.g., FIG. 4) (*Modern Neurology*, Vol. 2, T. H. Newton and D. G. Potts, eds., Chapter 5, p. 97ff, Clavadel Press, San Anselmo, Calif. (1984) is given by:

$$I = AM_o e^{-TEi/T2}(1 - 2e^{-(TR-TE/2)/T1} + e^{-TR/T1}) \quad (1)$$

For n echoes a similar analysis would produce the formula:

$$I_i = AM_o e^{-TEi/T2}\left(1 - (-1)^n e^{-TR/T1} - 2\sum_{l=1}^{n}(-1)^{n-l}e^{-(TR-(2l-1)\Delta TE/2)/T1}\right), \quad (2)$$

where $I_i$ is the intensity of a given pixel in the image corresponding to the i'th echo, A is a conversion factor, TR is the sequence repetition time and $\Delta TE$ is the time between consecutive echo times (i.e., in general, $\Delta TE = TE_{i+1} - TE_i$).

It will be instructive to consider the concept of calculated images, which make use of formulae such as stated in Equations (1) and (2). A calculated image is one in which each pixel has an intensity proportional to only one of the tissue specific parameters, e.g., $T_1$, $T_2$ or spin density $M_o$. Another useful concept is that of a pseudo-density (PD) image, in which the intensity is proportional to spin density weighted by some function of only one of the relaxation parameters (e.g., $T_1$ or $T_2$) and timing parameters (e.g., TR or TE). The techniques for producing such calculated images from the image data and their application to the present invention will be discussed next.

For simplicity, it will be assumed that each pixel location in the imaged object can be described by three NMR parameters: The spin lattice relaxation time $T_1$, the spin spin relaxation time $T_2$, and the spin density $M_o$. It will be recognized, of course, that each of these parameters can vary from pixel to pixel. Consider the case of multi-spin-echo data as a simple example of the technique. The intensity of a given pixel in an image corresponding to echo time $TE_i$ is given, in a simplified form of Equation (2), as $$I_i = AM_o e^{-TE_i/T_2} f(T_1, TR, \Delta T_E), \quad i=1,2,3,4,\ldots, \text{etc.} \quad (3)$$

The function f contains the $T_i$ dependence of the sequence (i.e., $$f(T_1, TR, \Delta TE) =$$

$$\left(1 - (-1)^n e^{-TR/T_1} - 2 \sum_{l=1}^{n} (-1)^{n-l} e^{-(TR-(2l-1)\Delta TE/2)/T_1}\right)$$

The value of $T_2$ for a particular pixel in a calculated $T_2$ image can be found by performing, using known (e.g., P. R. Bevington, "Data Reductional Analysis for the Physical Sciences," McGraw Hill, New York, (1969) Chaps. 8 and 110 linearized least square techniques, a fit to the intensity data at each echo time, $TE_i$, to the exponential form $$I_i = PD\, e^{-TE_i/T_2} \quad (4)$$

Figure 3:
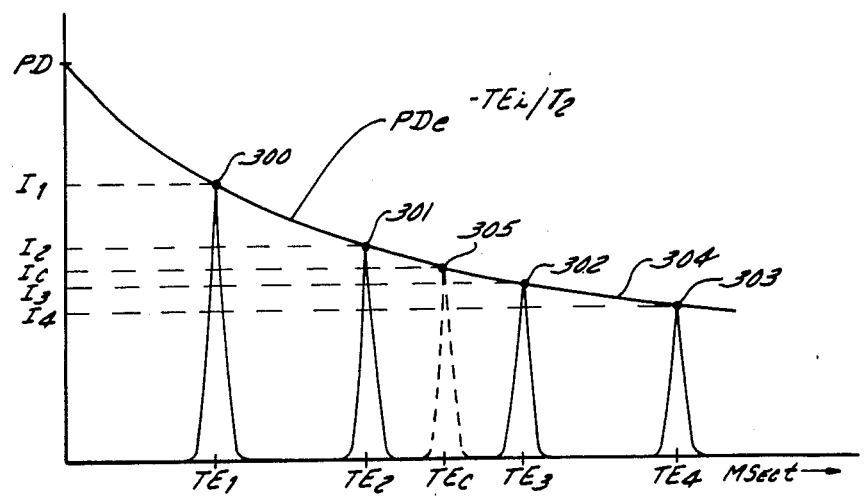
FIG. 3 illustrates a train of NMR spin-echo signals having variable amplitudes due to spin spin decay.

The relationship of data points, described by Equation (3), and the parameter (PD, $TE_i$, and $T_2$) for the fit, described by Equation (2), is shown diagrammatically in FIG. 3. In Equation (4), A, $M_O$, and $f(T_1, TR, \Delta TE)$ have been incorporated into a constant PD, since they do not depend on $T_2$. The constant PD can be referred to as pseudo spin density since in fact it has a dependence on true nuclear spin density distribution $M_o$, $T_1$, TR and $\Delta TE$. In Equation (4), it is assumed that $T_2$ decay is an exponential with a single decay constant $T_2$. Typically, for four data points (300-303, FIG. 3), a single exponential provides a good fit. In medical NMR imaging, based on clinical experience, most tissue has not been found to be so obviously multiexponential that a single exponential model does not work well for four data points.

With more data points in tissue known to be multiexponential, such as fatty liver or breast, the function used for the fit would have more terms. Extension of the fit equation from, for example, a single exponential (Equation (4) to two exponentials is shown in Equation (5).

$$I_i = A(PD_{01} e^{-TE_i/T_{21}} + PD_{02} e^{-TE_i/T_{22}}) f(T_1, TR, TE_i) \quad (5)$$

Equation (5) is a more accurate expression of Equation (3) for a system having two spin-spin decay constants ($T_{21}$ and $T_{22}$), wherein $PD_{o1}$ is the pseudospin density corresponding to spin-spin relaxation time, $T_{21}$, and $PD_{o2}$ is the corresponding pseudospin density for $T_{22}$. In this case, the more complex equation would have to be fit to the data to obtain $T_{21}$, $T_{22}$, and $PD_{o2}/PD_{o1}$. This will in general require the acquisition of more spin-echo signals to get the same accuracy as the simpler case described by Equation (4). Extension to more exponentials is accomplished by adding more terms to Equation (5).

Considering, now, for simplicity, only single exponential cases, Equation (4) can be utilized to perform a fit at each point (pixel) in the image to obtain two new images: One in which the intensity at each point is the value of PD resulting from the fit at that point, and another in which the intensity at each point is the $T_2$ from the fit. For a single exponential (Equation (4) following the equations below can be shown to produce reasonable estimates of the parameters $T_2$ and PD from the data $I_i$. These equations result from a linearized least-square analysis. It will be recognized by those skilled in the art that other equivalent expressions might be used to calculate $T_2$ and PD.

$$-\frac{1}{T_2} = b = \frac{1}{D}\left[\sum_{i=1}^{n} w_i \sum_{i=1}^{n} x_i y_i w_i - \sum_{i=1}^{n} x_i w_i \sum_{i=1}^{n} y_i w_i\right], \quad (6a)$$

$$PD = e^a, \quad (6b)$$

$$a = \frac{1}{D}\left[\sum_{i=1}^{n} x_i^2 w_i \sum_{i=1}^{n} y_i w_i - \sum_{i=1}^{n} x_i w_i \sum_{i=1}^{n} x_i y_i w_i\right], \quad (6c)$$

$$D = \sum_{i=1}^{n} w_i \sum_{i=1}^{n} x_i^2 w_i - \left(\sum_{i=1}^{n} w_i x_i\right)^2. \quad (6d)$$

In Equations (6a) and (6d), $$y_i = \ln(I_i) \quad (7a)$$

$$x_i = TE_i \quad (7b)$$

$$w_i = I_i/\sigma_i, \quad (7c)$$

wherein $\sigma_i^2$ is the variance of the $I_i$. Typically, in NMR, the values $I_i$ have the same value of $\sigma_i$. The PD image contains both $T_1$ and true spin density factors, while the $T_2$ image only contains $T_2$ factors. The values of $T_2$ and PD calculated utilizing Equations (7a)-(7c) can be used in Equation (4) to generate an image corresponding to a particular spin-echo time $TE_c$ (such as that shown in FIG. 3 along the horizontal axis) for which actual spin-echo data was not observed. Equation (4) is used to calculate an image intensity $I_c$ (shown along the vertical axis) at each image point with the corresponding values of PD and $T_2$ previously determined ($I_c = PDe^{-TE_c-T_2}$). It is possible to produce such a generated image at any value of $TE_c$. However, it is most reasonable to choose a $TE_c$ time which is in the range of time spanned by the the actual observed spin-echo signals $TE_1$-$TE_4$, as indicated in FIG. 3. As $TE_c$ is increased, $T_2$ contrast will generally become more apparent until noise dominates. Agreement between the generated image and an actual (acquired) image at $TE_c$ will depend upon the value of $TE_c$ selected and on the quality of the fit. For values of $TE_c$ in the range of that of the acquired images (i.e., between $TE_1$ and $TE_4$) in a multi-echo sequence, the agreement will be good. For values of TE outside the range, the calculated images can diverge from the correct value, especially if a single exponential fit is used on multiexponential data. In general, however, the generated images are likely to give a close representation of the contrast in an image acquired at that value of $TE_c$. The generated image is a meaningful combination of the original acquired images since it reproduces the contrasts that a single spin-echo image would have if acquired at $TE_c$.

One application of the inventive method is the generation of a spin-echo image by computing an image intensity value $I_c$ at each pixel using the equation:

$$I_c = PDe^{-TE_c/T_2} \quad (8)$$

where $T_2$ and PD are computed using Equations (6a)–(6d). The relation between typical values of $I_c$, $TE_c$ equal and the $I_i$, $TE_i$ referred to in Equation (3) is diagrammed in FIG. 3. The generated image has in general a better signal-to-noise ratio compared to an image that is acquired using a single spin-echo signal at same spin-echo time $TE_c$ and sequence repetition time TR.

Whether the generated image has improved S/N relative to the acquired image depends upon whether the variance ratio, R, has a value that is less than unity, where:

$$R^2 = \frac{e^{-2TE_c/T_2}}{N^*(\overline{x^2} - (\bar{x})^2)} (\overline{x^2} - (\bar{x})^2 + (\bar{x} - TE_c)^2), \text{ where} \quad (9)$$

$$N^* = \sum_{i=1}^{n} e^{-2TE_i/T_2}$$

$$\overline{x^2} = \frac{1}{N^*} \sum_{i=1}^{n} (e^{-2TE_i/T_2})(TE_i)^2$$

$$\bar{x} = \frac{1}{N^*} \sum_{i=1}^{n} (e^{-2TE_i/T_2})(TE_i)$$

The expression for $R^2$ is the ratio of the variance of a pixel in the generated image to the variance of a pixel in the image that would result if an image were acquired at $TE = TE_c$. Hence, when the expression is less than unity the variance in the acquired image is greater than the variance of the generated image. Since the pixel intensity is the same for both images, the SNR, which is the signal divided by the square root of the variance, is superior in the generated image.

The use of Equation (9) to determine whether a generated image has an improved signal-to-noise ratio is merely exemplary. Other methods may also be used. For example, an experimental approach could be employed whereby a number of images at different values of $TE_c$ could be generated, and then the signal-to-noise ratios of the images compared to that of acquired images having substantially the same contrast, to obtain values $TE_c$ for which the signal-to-noise ratio is improved.

Expression (9) is derived using known statistical and mathematical techniques from Equations (6a–d). For other signal dependence formulae, such as that exemplified by Equation (5), or calculational formulae different from Equations (6a–d), a modified expression derivable by those skilled in the art would be used.

As background material an example of such a derivation for Equation (9) is now presented.

The variance in the calculated image ($I_c$) is denoted as $\sigma^2 I_c$. $I_c$ is given by Equation (8). $\sigma^2 I_c$ is a function of the statistical variation in PD and $T_2$, since $TE_c$ is fixed. The statistical variation in PD and $T_2$ is determined by the (independent) statistical variation of the $I_i$, since PD and $T_2$ are functions of the $I_i$ (Equations (6a–d)). Each of the $I_i$ have the same variance due to the peculiarities of NMR data acquisition, although this is not a limitation to the technique. Standard references such as Bevington (above) show that $$\sigma_{I_c}^2 = \sum_{i=1}^{n} \left( \frac{\partial I_c}{\partial I_i} \bigg|_{\overline{I_i}} \right)^2 \sigma^2, \quad (10)$$

where $\sigma^2$ is the (common) variance of the $I_i$. The partial derivatives are evaluated using Equations (6a–d). The derivatives are to be evaluated at the average value of each $I_i$:

$$\overline{I_i} = \overline{PD} \, e^{-TE_i/\overline{T_2}}, \quad (11)$$

where averages are indicated by the 'bar', e.g., $\overline{I_i}$, $\overline{PD}$ or $\overline{T_2}$. Typically, for reasonably good SNR (greater than, e.g., 7, which is usually the case in NMR imaging) $T_2$ and $\overline{T_2}$ can be used interchangably.

Now $$\frac{\partial I_c}{\partial I_i} = e^{-TE_c/T_2} \left( \frac{\partial PD}{\partial I_i} + \frac{TE_c}{(T_2)^2} PD \cdot \frac{\partial T_2}{\partial I_i} \right), \quad (12)$$

also, using the chain rule and Equation (6b)

$$\frac{\partial PD}{\partial I_i} = \frac{\partial PD}{\partial y_i} \frac{\partial y_i}{\partial I_i} = PD \frac{\partial a}{\partial y_i} \frac{\partial y_i}{\partial I_i}$$

Equation (6c) gives $$\frac{\partial a}{\partial y_i} = \frac{1}{D} \left[ w_i \sum_{j=1}^{n} x_j^2 w_j - x_i w_i \sum_{j=1}^{n} x_j w_j \right]$$

and Equation (7a) gives $$\frac{\partial y_i}{\partial I_i} = \frac{1}{I_i}$$

Again using the chain rule $$\frac{\partial T_2}{\partial I_i} = (T_2)^2 \frac{\partial}{\partial y_i} \left( \frac{-1}{T_2} \right) \frac{\partial y_i}{\partial I_i}$$

and from Equation (6a)

$$\frac{\partial}{\partial y_i} \left( \frac{-1}{T_2} \right) = \frac{\partial b}{\partial y_i} = \frac{1}{D} \left[ x_i w_i \sum_{j=1}^{n} w_j - w_i \sum_{j=1}^{n} x_j w_j \right]$$

using $w_i$ from Equation (7c) and the expression for the average value of $I_i$ (Equation 11) gives from the above expressions $$\frac{\partial PD}{\partial I_i} = \frac{N^* (PD)^4}{D \sigma^4} [\overline{x^2} - x_i \bar{x}] e^{-TE_i/T_2}$$

$$\frac{\partial T_2}{\partial I_i} = \frac{N^* (T_2)^2}{D} \frac{(PD)^3}{\sigma^4} [x_i - \bar{x}] e^{-TE_i/T_2}$$

where the notation of $\bar{x}$, $\overline{x^2}$, etc., was introduced in Equation (9) above.

Hence, using the above and Equation (12)

$$\frac{\partial I_c}{\partial I_i} =$$

$$\frac{N^*}{D} \frac{(PD)^4}{\sigma^4} e^{-TE_c/T_2} [\overline{x^2} - x_i \bar{x} - TE_c(x_i - \bar{x})] e^{-TE_i/T_2}$$

Then Equation (10) becomes $$\sigma_{Ic}^2 = \sigma^2 \frac{(N^*)^2}{D^2} \left(\frac{(PD)^4}{\sigma^4}\right)^2 e^{-2TEc/T2}$$

$$\sum_{i=1}^{n} (\overline{x^2} - x_i\bar{x} - TE_c(x_i - \bar{x}))^2 e^{-2TEi/T2}$$

Also, from the above and Equation (6d)

$$D^2 = \left(\frac{(PD)^4}{\sigma^4}\right)^2 (N^*)^4(\overline{x^2} - (\bar{x})^2)^2 \text{ so } \sigma_{Ic}^2 =$$

$$\sigma^2 \frac{e^{-2TEc/T2}}{(N^*)^2(\overline{x^2} - (\bar{x})^2)^2} \sum_{i=1}^{n} (\overline{x^2} - x_i\bar{x} - TE_c(x_i - \bar{x}))^2 e^{-2TEi/T2}$$

carrying out the sum gives $$\frac{\sigma_{Ic}^2}{\sigma^2} = \frac{e^{-2TEc/T2}}{N^*(\overline{x^2} - (\bar{x})^2)} (\overline{x^2} - (\bar{x})^2 + (\bar{x} - TE_c)^2)$$

which is Equation (9).

Figure 6A:
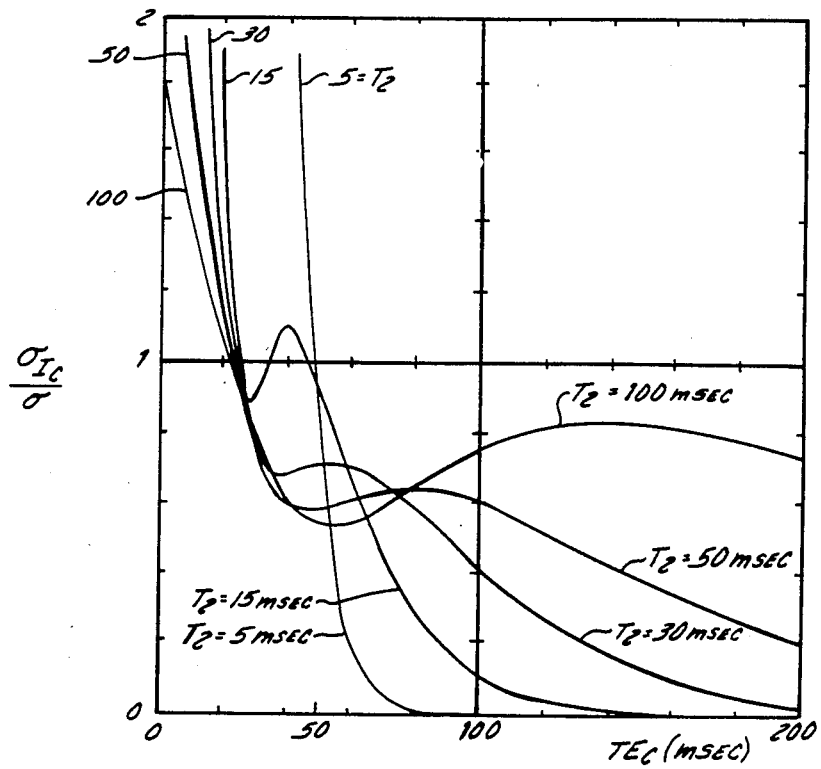
FIGS. 6A and 6B illustrate graphically the ratio R versus spin-echo delay time $TE_c$.
Figure 6B:
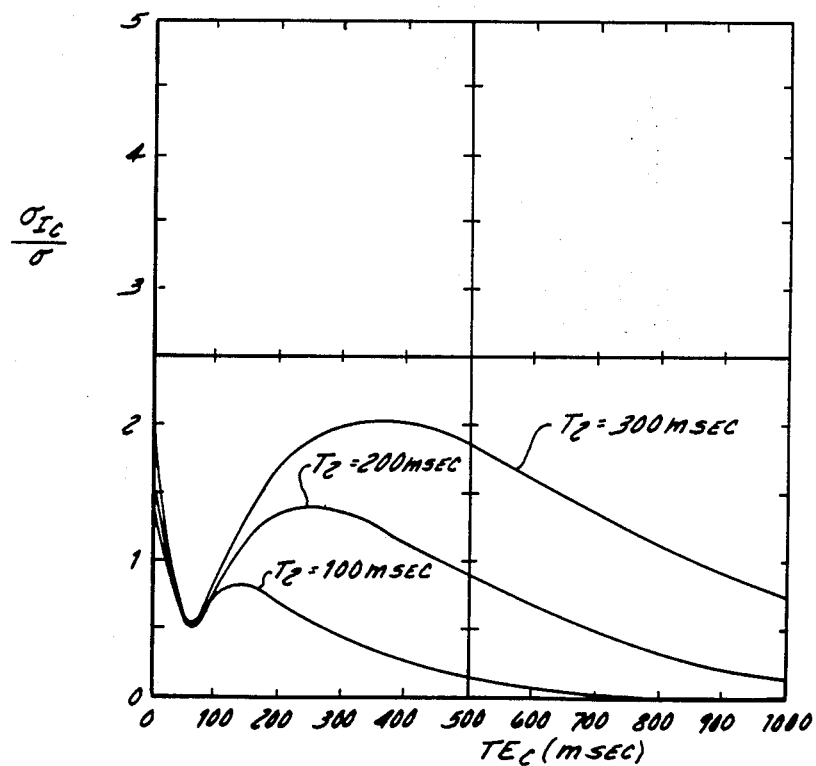

The expression $R = \sigma_{Ic}/\sigma$ vs. $TE_c$ is depicted graphically in FIGS. 6A and 6B for N=4, $TE_i$=25, 50, 75, 100 msec. for $T_2$=5, 15, 30, 50, 100, 200, 300. Note that there are two regions where R falls below unity. The first region is near $TE_c$=50 msec. The other region is for large values of $TE_i$. For example, for $T_2$ =200 msec., the value is less than unity for $25 \leq TE_c \leq 125$ msec. and for $TE_c \leq 460$ msec. Typically, there will always be a $TE_c$ for which R is less than unity since the exponential decay in Equation (9) dominates. Note in FIG. 6A that for $5 \leq T_2 \leq 100$ msec., the intermediate region is below unity, resulting in large region for which $\sigma_{Ic}$ is an improvement over $\sigma$. For example, for $T_2$=50 msec. all $TE_c > 30$ msec. results in an improvement.

In the above-described inventive technique, generated images are produced essentially by extrapolating the PD images to some value $TE_c$ using the $T_2$ image.

In accordance with another embodiment of the invention, instead of directly extrapolating the PD image to some $TE_c$ spin-echo time, it is also possible to use only the $T_2$ image to extrapolate each of the acquired images at spin-echo times $TE_1$-$TE_4$ to a particular spin-echo time $TE_c$ by multiplying each pixel in each of the acquired images by a factor $$e^{-(TE_c - TE_i)/T2} \tag{13}$$

In this expression, $TE_i$ is the time of the acquired image echo and $T_2$ is the $T_2$ value (determined using Equation (7) for the particular pixel being extrapolated. Application of these factors to each of the images acquired at, for example, $TE_1$-$TE_4$ essentially extrapolates or interpolates each image to the chosen spin-echo time $TE_c$. That is, the intensities identified by points 300-303 corresponding to spin-echo times $T_1$-$T_4$ (FIG. 4), respectively, are shifted along curve 304 so as to give an intensity typical of that designated by reference numeral 305, at spin-echo time $TE_c$. The new images resulting from the application of these factors will now have the same contrast, as if they were acquired at the same spin-echo time $TE_c$. The new images can now be averaged together to produce an image possibly having an improved signal-to-noise ratio (SNR) when compared with that of a single image if one were to be acquired at the extrapolation time $TE_c$. This extrapolated, averaged image is also easily interpretable as corresponding to an image acquired at the echo time $TE_c$, with unchanged TR and $T_1$ dependence which they would not be if they were added without extrapolation.

The extrapolation procedure described with reference to Expression (8), can either increase or decrease the noise in the extrapolated image over that of an acquired image at the extrapolation time. It will be recognized that the values of $TE_c$ for which the SNR of the extrapolated, averaged image is improved is described by Expression (9) for S/N in the acquired images that is high enough to allow the statistical assumption of asymptotic normality; i.e., so that the central limit theorem can be invoked.

In general, the generated image contains the same information that the extrapolated/averaged image does. However, since the equations involved are non-linear, the weighing of the data is different between the two methods. The important features of preserving contrast interpretability and noise reduction (in most cases) is, however, common to both embodiments. It should be further noted that if an image were actually acquired at the chosen echo time $TE_c$, there would be differences between the acquired image and the extrapolated-/averaged or generated image. These differences are due to errors in the original images which produce errors in the evaluation of $T_2$ and due to the approximation made in Equation (2). For example, as already described with reference to Equation (3), some tissues actually have several values of $T_2$ in a given pixel location.

Figure 4:
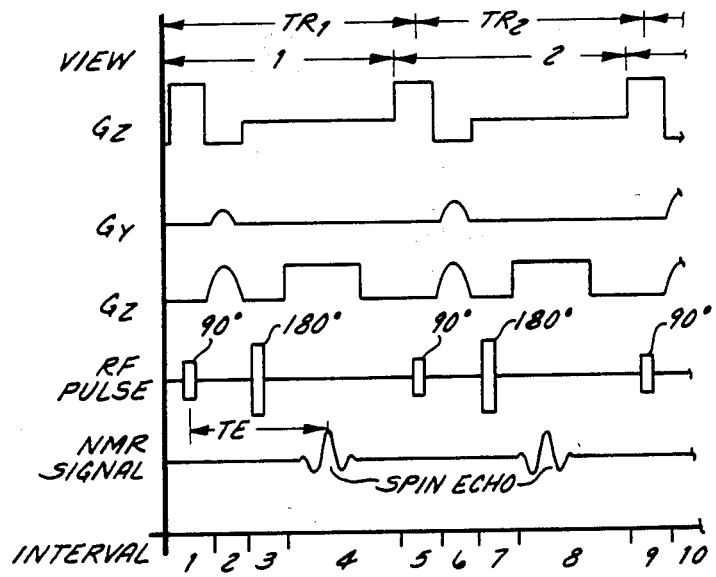
FIG. 4 is similar to FIG. 2 and depicts two views of a spin-warp pulse sequence useful with the invention for acquiring image data at differing repetition times TR.

In accordance with yet another embodiment of the invention, combined images can be obtained with pulse sequences for which the timing parameters that vary $T_1$ sensitivity are changed. For example, FIG. 4 depicts a two-dimensional spin warp pulse sequence substantially identical to the pulse sequence described hereinbefore with reference to FIG. 2, but in which only a single spin-echo signal is observed in each view. Thus, in intervals 4 and 8 only a single spin-echo is generated by the application of a 180° RF pulse in intervals 3 and 7. In this case, a series of single spin-echo images are obtained with an identical spin-echo time TE, but wherein each image is obtained for a unique sequence repetition time $TR_i$ (where i=1, ..., n, and where n is the total number of images in the series). That is, during a single scan resulting in one image, TR is held constant, but is changed in a subsequent scan which will result in a second image in the series, and so on. Such a series of spin-echo images will have pixel intensity given by $$I_i = AM_0 h(TE, T_2) f(TR_i, TE, T_1) \tag{14}$$

where f and h are functions containing the pulse sequence dependence on the given parameters. For example, for the single spin-echo pulse sequence, as shown in FIG. 4.

$$h(TE, T_2) = e^{-TE/Ts} \tag{15}$$

$$f(TR_i, TE, T_1) = (1 - 2e^{-(TR_i - TE/2)/T1} + e^{-TR_i/T1}) \tag{16}$$

This can be rewritten in terms of a PD' and a $T_i$ function:

$$I_i = PD' f(TR_i, TE, T_1) \tag{17a}$$

where $PD' = A M_o h(TE, T_2)$

More specifically, $$I_i = PD'(1 - 2e^{-(TR_i - TE/2)/T_1} + e^{-TR_i/T_1}) \quad (17b)$$

where $PD' = A M_o e^{-TE/T_2}$

Hence, as described hereinbefore with reference to the multi-spin-echo images, a value of $T_1$ for each pixel and a $PD'$ can be obtained through fitting procedures similar to those described with reference to Bevington hereinbefore.

Figure 5:
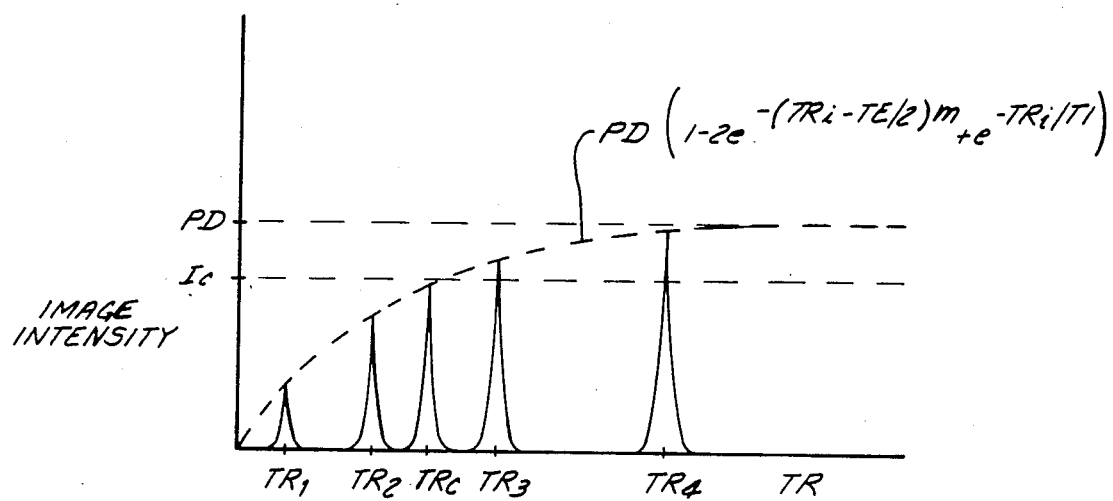
FIG. 5 illustrates graphically pixel intensity versus sequence repetition time TR.

Extrapolated/interpolated images can be calculated at some predetermined sequence repetition time $TR_c$, indicated in FIG. 5, by multiplying each acquired pixel intensity by a factor $g$ having the form $$g_i = \frac{f(TR_o, TE, T_1)}{f(TR_i, TE, T_1)} \quad (18a)$$

where in the present example $$g_i = \frac{(1 - 2e^{-(TR_c - TE/2)/T_1} + e^{-TR_c/T_1})}{(1 - 2e^{-(TR_i - TE/2)/T_1} + e^{-TR_i/T_1})}$$

or alternatively by evaluating $$I_c = AM_o h(TE, T_2) f(TR_o, TE, T_1)$$

where in the present example $$I_c = PD'(1 - 2e^{-(TR_c - TE/2)/T_1} + e^{-TR_{pis\ c}/T_1})$$

Then in accordance with this embodiment of the invention the various extrapolated images can be combined (e.g., averaged) to achieve an S/N improvement (for certain values of $TR_c$). Alternatively, a generated image at the desired $TR_c$ could be calculated using Equation (12), again achieving an improvement for certain values of $TR_c$.

In the general case, if enough images are obtained with varying $T_R, T_E$ or other timing parameter, and if the equations describing the dependence of image intensity of $T_1$, $T_2$, $M_o$ (spin density) or other parameters (e.g., $T_{21}$, $T_{22}$, $M_{o1}$ and $M_{o2}$ described hereinbefore) are known, then a map or image of each parameter may be obtained by fitting the equations at each pixel to the intensity data. Then the equations may be used with the maps to extrapolate/interpolate the original images to a chosen combination of TR, $T_E$ and other timing parameters appropriate to the particular pulse sequence used. For example, in the inversion recovery type of pulse sequence TI, TE, and TR timing parameters are used, wherein TE and TR are as defined hereinbefore, and wherein TI is the time interval between an inverting 180° RF pulse (or an adiabatic fast passage) and the 90° RF detection pulse. The images may be advantageously combined to produce, in accordance with the invention, an image with better signal to noise compared to an image constructed with measurements actually acquired at the same time parameters. Alternatively, a generated image at the desired TR, TE can be formed. The advantage of the combined image may also be simply the production of an image at a chosen combination of $T_R$, $T_E$ or other timing parameter in order to obtain the best contrast for a give tissue or pathology. If it were known, a priori, that a given tissue or pathology had a certain range of $T_1$, $T_2$, $M_o$, etc., known equations, e.g., Equation (1) could be used, to predict the best combination of $T_R$, $T_E$, etc., to produce the maximum contrast for the tissue or pathology. Then the combined image could be chosen to correspond to this set of $T_R$, $T_E$.

The preferred embodiments of the invention have been disclosed hereinbefore by way of example with reference to a 2DFT pulse sequence. It will be recognized by those skilled in the art that the invention could also be practiced with a three-dimensional embodiment of the sequence. In this case, variable amplitude $G_z$ phase-encoding gradient pulses would be applied in intervals 2 and 12, etc., of FIG. 2 to encode spatial image information in the z-axis direction. A three-dimensional spin-warp pulse sequence is disclosed and claimed in U.S. Pat. No. 4,431,968, assigned to the same assignee as the present invention and which is incorporated herein by reference as background material.

It will be further recognized that the invention could also be practiced with other than a Fourier transform type of imaging sequence. Examples of such sequences are two- and three-dimensional implementation of multiple-angle projection reconstruction techniques. In such sequences, NMR projection data is obtained from a plurality of angles (e.g., within at least a 180 degree arc in a two-dimension implementation) in the sample region of interest. The image is reconstructed by back-projecting the line integral projection data obtained for each direction. The method of the invention is directly applicable to this sequence if each different projection is treated as a view.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for generating a computed NMR image having improved signal-to-noise ratio relative to an acquired NMR image corresponding to substantially similar timing parameters, said method comprising the steps of:

exciting, spatially encoding and detecting NMR signals in a sample object to obtain a plurality of acquired images according to a timing parameter which varies between acquired images;

fitting NMR data corresponding to each pixel of said acquired images into an equation relating NMR parameters of said object to said NMR signals in order to produce a plurality of fitted equations; and generating said computed image corresponding to a single value of said timing parameter using said fitted equations.

2. The method of claim 1, wherein said single value of said timing parameter is selected within a range over which said timing parameter is varied in obtaining said plurality of acquired images.

3. A method for generating a computed NMR image comprising the steps of:

acquiring NMR data at a plurality of spin-echo times $TE_i$ ($i = 1, 2, \ldots, n$);

producing $I_i$ ($i = 1, 2, \ldots, n$) acquired images, each image $I_i$ being constructed using NMR data acquired at a corresponding $TE_i$ spin-echo time;

generating for each aquired image $I_i$ as many $T_2$ values as there are pixel elements in each $I_i$ image, said $T_2$ values being generated using intensity information from corresponding pixels from at least two of said acquired images;

generating for each of said $T_2$ values an extrapolation factor of the form $$e^{-(TE_c - TE_i)/T_2}; \text{ and}$$

extrapolating at least one of said acquired images to a time $TE_c$ by multiplying the pixel intensity in said one acquired image by the corresponding generated extrapolation factor to create a first new image with an image contrast characteristic substantially similar to that of an acquired image at a time $TE_c$.

4. The method of claim 1 wherein said NMR parameters of said object comprise spin-spin relaxation time $T_2$ and its pseudo-density, and wherein said timing parameter comprises spin-echo time $TE_c$.

5. The method of claim 4 wherein said timing parameter generates a plurality of $T_2$ values.

6. The method of claim 5 further comprising the step of selecting a value of said timing parameter $TE_c$ such that the variance ratio R is less than 1.

7. The method of claim 6 wherein said variance ratio R is computed using $$R^2 = \frac{e^{-2TE_c/T_2}}{N*\overline{(x^2 - (\bar{x})^2)}} (\overline{x^2} - (\bar{x})^2 + (\bar{x} - TE_c)^2)$$

8. The method of claim 6 further comprising the steps of:

acquiring said NMR data at a plurality of spin-echo times $TE_i$ (i=1, 2, ..., n);

producing $I_i$ (i=1, 2, ..., n) acquired images each image $I_i$ being constructed using NMR data acquired at a corresponding $TE_i$ spin-echo time;

generating for each acquired image $I_i$ as many $T_2$ values as there are pixel elements in each said $I_i$ image, said $T_2$ values being generated using intensity information from corresponding pixels from at least two of said acquired images;

generating for each of said $T_2$ values an extrapolation factor of the form $e^{-(TE_c - TE_i)/T_2}$; and extrapolating at least one of said acquired images to a time $TE_c$ by multiplying the pixel intensity in said one acquired image by the corresponding generated extrapolation factor to create a first new image with an image contrast characteristic substantially similar to that of an acquire image at a time $TE_c$.

9. The method of claim 8 further comprising the steps of:

extrapolating another of said acquired images to said time $TE_c$ to create a second new image; and averaging said first and second new images to create an average image having an improved signal-to-noise ratio relative to an image acquired at time $TE_c$.

10. The method of claim 1 wherein said NMR parameters of said object comprise spin-lattice relaxation time $T_1$, and its associated pseudo-density, and wherein said timing parameter comprises pulse sequence repetition time TR.

11. The method of claim 10 wherein said timing parameter generates a plurality of $T_1$ values.

12. The method of claim 11 further comprising the step of selecting a value of said timing parameter $TR_c$ such that the variance ratio R is less than 1.

13. The method of claim 1 wherein said NMR parameters of said object comprise spin-spin and spin-lattice relaxation times and associated spin density $M_o$, and wherein the pulse sequence repetition time TR and spin-echo time TE are selected as said timing parameters.

* * * * *

UNITED STATES PATENT AND TRADEMARK OFFICE
CERTIFICATE OF CORRECTION

PATENT NO. : 4,709,212

DATED : November 24, 1987

INVENTOR(S) : James R. MacFall and Gary H. Glover

It is certified that error appears in the above-identified patent and that said Letters Patent is hereby corrected as shown below:

Face Page in "Abstract", last line, change "effect" to --affect--.
Column 2, line 14, change "in" to --is--.
Column 4, line 35, change "of" to --or--.
Column 7, line 21, change "0" to -- ) --.
Column 8, line 54, change "TE" to --$TE_c$--.
Column 9, line 3, delete the word "equal".
Column 10, line 10, change "$T_2$" to -- $\overline{T_2}$ --.
Column 11, line 32 change " $\leq$ " to -- > --.
Column 12, line 61 (Equation 15), second occurrence, change "$T_s$" to --$T_2$--.
Column 13, line 33, delete in Equation the letters "pis".
Column 15, line 2, after "each" insert --said--.
Column 15, line 10 re-draft Equation as follows:

$$-- e^{-(TE_c - TE_i)/T_2} --$$

Signed and Sealed this

Twenty-seventh Day of June, 1989

Attest:

DONALD J. QUIGG

*Attesting Officer*      *Commissioner of Patents and Trademarks*